(12) United States Patent
Li et al.

(10) Patent No.: US 9,960,354 B1
(45) Date of Patent: May 1, 2018

(54) METHOD FOR MAKING THIN FILM TRANSISTOR

(71) Applicants: Tsinghua University, Beijing (CN); HON HAI PRECISION INDUSTRY CO., LTD., New Taipei (TW)

(72) Inventors: Dong-Qi Li, Beijing (CN); Yang Wei, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days. days.

(21) Appl. No.: 15/662,253

(22) Filed: Jul. 27, 2017

(30) Foreign Application Priority Data

Oct. 31, 2016 (CN) .......................... 2016 1 0932307

(51) Int. Cl.
| | |
|---|---|
| *H01L 51/00* | (2006.01) |
| *H01L 51/05* | (2006.01) |
| *H01L 51/10* | (2006.01) |
| *G01R 31/265* | (2006.01) |
| *G01R 31/26* | (2014.01) |

(52) U.S. Cl.
CPC ...... *H01L 51/0031* (2013.01); *G01R 31/2621* (2013.01); *G01R 31/2653* (2013.01); *H01L 51/0048* (2013.01); *H01L 51/055* (2013.01); *H01L 51/0516* (2013.01); *H01L 51/0545* (2013.01); *H01L 51/0558* (2013.01); *H01L 51/105* (2013.01)

(58) Field of Classification Search
CPC ... B82Y 40/00; H01L 51/0048; H01L 51/444; H01L 2221/1094; H01L 51/102; H01L 21/02606; H01L 29/0669
See application file for complete search history.

(56) References Cited

U.S. PATENT DOCUMENTS

| | | | | |
|---|---|---|---|---|
| 9,843,006 B2 * | 12/2017 | Li | ........................ | H01L 51/0541 |
| 2012/0104328 A1 * | 5/2012 | Park | ........................ | B82Y 10/00 |
| | | | | 252/510 |

* cited by examiner

*Primary Examiner* — Roy Potter
(74) *Attorney, Agent, or Firm* — ScienBiziP, P.C.

(57) ABSTRACT

A method for making thin film transistor includes: providing a gate electrode and forming an insulating layer on the gate electrode; providing a carbon nanotube film comprising a plurality of metallic carbon nanotubes and a plurality of semiconducting carbon nanotubes; laying the carbon nanotube film on a surface of the insulating layer, and placing the carbon nanotube film under a scanning electron microscope to take photo of the carbon nanotube film to distinguish the plurality of metallic carbon nanotubes and the plurality of semiconducting carbon nanotubes; removing the metallic carbon nanotubes, and forming a source electrode and a drain electrode on a surface of the semiconducting layer.

16 Claims, 4 Drawing Sheets

METHOD FOR MAKING THIN FILM TRANSISTOR

CROSS-REFERENCE TO RELATED APPLICATIONS

This application claims all benefits accruing under 35 U.S.C. § 119 from China Patent Application No. 201610932307.4, filed on Oct. 31, 2016, in the China Intellectual Property Office, the contents of which are hereby incorporated by reference.

FIELD

The present disclosure relates to a method for making thin film transistor.

BACKGROUND

A typical thin film transistor (TFT) is made of a substrate, a gate electrode, an insulation layer, a drain electrode, a source electrode, and a semiconducting layer. The thin film transistor performs a switching operation. In use, the thin film transistor modulate an amount of carriers accumulated in an interface between the insulation layer and the semiconducting layer from an accumulation state to a depletion state, with applied voltage to the gate electrode. Thus, the thin film transistor can change an amount of the current passing between the drain electrode and the source electrode. In practical use, a high carrier mobility affect by the material of the semiconducting layer of the thin film transistor is desired.

In prior art, the material of the semiconducting layer is amorphous silicone (a-Si), poly-silicone (p-Si), or organic semiconducting material. The carrier mobility of an a-Si TFT is relatively lower than a p-Si TFT. However, the method for making the p-Si TFT is complicated and has a high cost. The organic TFT is flexible but has low carrier mobility.

Carbon nanotubes (CNTs) are a novel carbonaceous material and received a great deal of interest since the early 1990s. Carbon nanotubes have interesting and potentially useful heat conducting, electrical conducting, and mechanical properties. Further, there are two kinds of carbon nanotubes: metallic carbon nanotubes and semiconducting carbon nanotubes determined by the arrangement of the carbon atoms therein. The carrier mobility of semiconducting carbon nanotubes along a length direction thereof can reach about 1000 to 1500 $cm^2V^{-1}s^{-1}$. Thus, in prior art, a TFT adopting carbon nanotubes as a semiconducting layer has been produced. However, the the semiconducting layer prepared often includes many metallic carbon nanotubes except semiconducting carbon nanotubes, which will affect the performance of the semiconductor layer.

What is needed, therefore, is to provide a method for making a thin film transistor that can overcome the above disadvantages.

BRIEF DESCRIPTION OF THE DRAWINGS

Implementations of the present technology will now be described, by way of example only, with reference to the attached figures, wherein.

DETAILED DESCRIPTION

Figure 1:
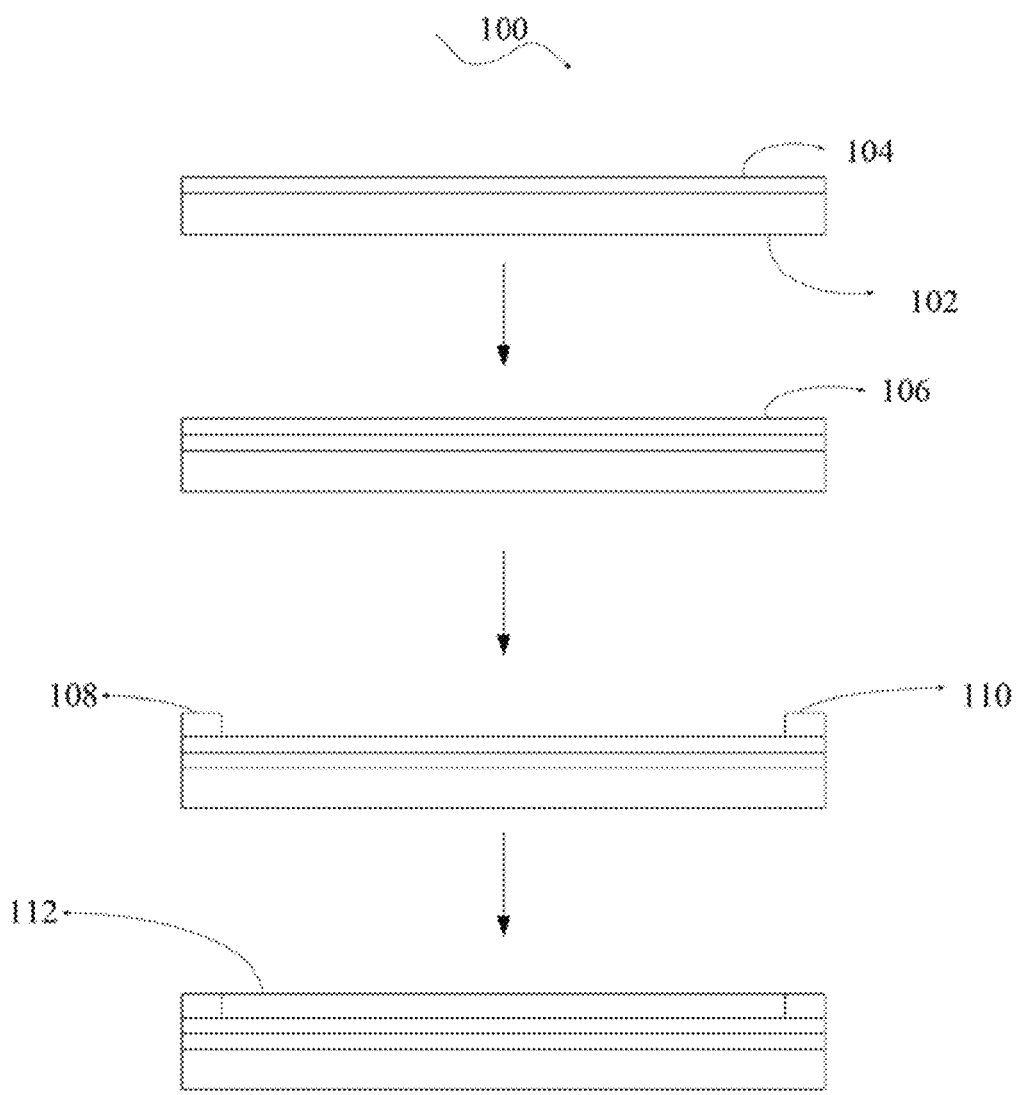
FIG. 1 is structure schematic view showing a process of the method for making a thin film transistor according to one embodiment.

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to illustrate details and features of the present disclosure better.

Several definitions that apply throughout this disclosure will now be presented.

The term "substantially" is defined to be essentially conforming to the particular dimension, shape, or other feature which is described, such that the component need not be exactly or strictly conforming to such a feature. The term "comprise," when utilized, means "include, but not necessarily limited to"; it specifically indicates open-ended inclusion or membership in the so-described combination, group, series, and the like.

Figure 2:
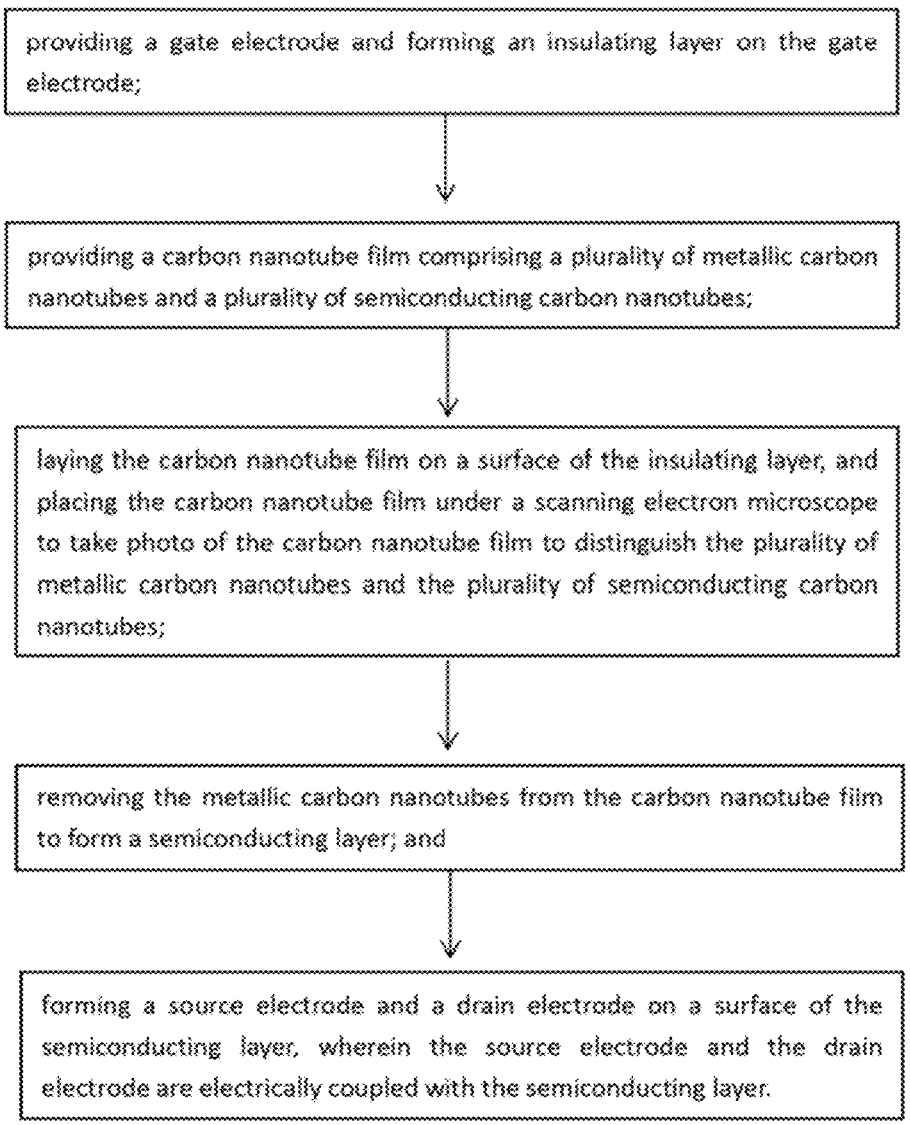
FIG. 2 is a chart flow showing a method for making a thin film transistor according to one embodiment.

Referring to FIGS. 1 and 2, one embodiment is described in relation to a method for making thin film transistor. The method for making thin film transistor includes steps of:

S1: providing a gate electrode 102 and forming an insulating layer 104 on the gate electrode 102;

S2: providing a carbon nanotube film comprising a plurality of metallic carbon nanotubes and a plurality of semiconducting carbon nanotubes;

S3: laying the carbon nanotube film on a surface of the insulating layer 104, and placing the carbon nanotube film under a scanning electron microscope to take photo of the carbon nanotube film to distinguish the plurality of metallic carbon nanotubes and the plurality of semiconducting carbon nanotubes;

S4: removing the metallic carbon nanotubes from the carbon nanotube film to form a semiconducting layer 106; and S5: forming a source electrode 108 and a drain electrode 110 on a surface of the semiconducting layer 106, wherein the source electrode 108 and the drain electrode 110 are electrically coupled with the semiconducting layer 106.

In step S1, a material of the gate electrode 102 has a good conductivity. The material of the gate electrode 102 can be metal, conductive organic material, or a doped conductive material. In the present embodiment, the material of the gate electrode 102 is doped silicon. A thickness of the gate electrode 102 can be in a range from about 0.5 nanometers to about 100 micrometers. A material of the insulating layer 104 can be oxide or polymer material. In the present embodiment, the material of the insulating layer 104 is silicon oxide. A thickness of the insulating layer 104 ranges from about 50 nanometers to about 300 nanometers. The insulating layer 104 can be formed on the gate electrode 102 by coating method.

In step S2, the carbon nanotube film includes a plurality of carbon nanotubes. The plurality of carbon nanotubes can be single-walled carbon nanotubes, double-walled carbon nanotubes or multi-walled carbon nanotubes. The plurality of carbon nanotubes includes the plurality of metallic carbon nanotubes and the plurality of semiconducting carbon nanotubes. A diameter of the carbon nanotubes can be in a range from about 0.5 nanometers to about 150 nanometers. In some embodiments, the diameter of the carbon nanotubes can be in a range from about 1 nanometer to about 10 nanometers. The plurality of carbon nanotubes can be arranged randomly or orderly. In one embodiment, the plurality of carbon nanotubes can be crossed with each other. In other embodiment, the plurality of carbon nanotubes can be arranged parallel with each other. In the present embodiment, the plurality of carbon nanotubes in the carbon nanotube film are parallel with each other and parallel with the surface of the insulating layer 104.

Step S3 includes sub-steps of:

S31: placing the carbon nanotube film with the gate electrode 102 and the insulating layer 106 under the scanning electron microscope, adjusting the scanning electron microscope with an accelerating voltage ranging from about 5 KV to about 20 KV, a dwelling time ranging from about 6 microseconds to about 20 microseconds and a magnification ranging from about 10000 times to about 100000 times, and taking photos of the carbon nanotube film with the scanning electron microscope;

S32: obtaining a photo of the carbon nanotube film, wherein the photo shows the plurality of carbon nanotubes and a background, the plurality of carbon nanotubes includes the plurality of metallic carbon nanotubes with lighter color than a color of the background and the plurality of semiconducting carbon nanotubes with deeper color than the color of the background.

In step S31, in some embodiments, the accelerating voltage ranges from about 15 KV to about 20 kV and the dwelling time ranges from about 10 microseconds to about 20 microseconds. In the present embodiment, the acceleration voltage is 10 kV, the dwelling time is 20 microseconds, and the magnification is 20,000 times.

Figure 3:
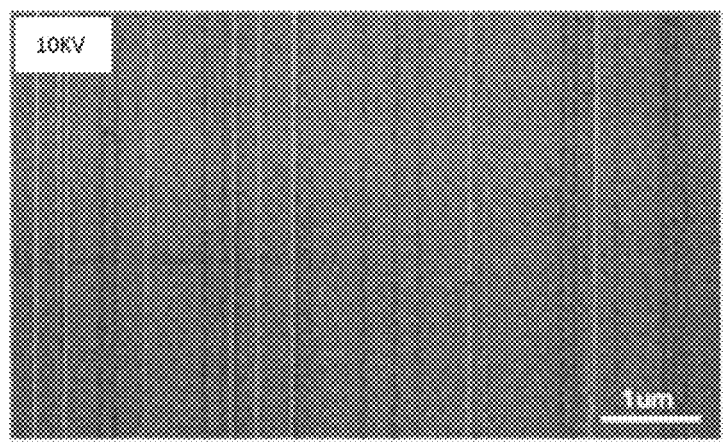
FIG. 3 is a photo of a carbon nanotube film used in the thin film transistor obtained in the method for making a thin film transistor.

In step S31, a photo of the carbon nanotube film is obtained as shown in FIG. 3. FIG. 3 shows a background and an image of the plurality of carbon nanotubes in the carbon nanotube film. As can be seen from FIG. 3, the color of the plurality of metallic carbon nanotubes is lighter than the color of the background, and the of color of the plurality semiconducting carbon nanotubes is deeper than the color of the background.

In the present disclosure, the method for making semiconducting layer 106 includes a step of distinguishing types of carbon nanotubes by using a scanning electron microscope. Because of the accelerating voltage and the dwelling time of the scanning electron microscope disclosed in the present disclosure, a photo of carbon nanotue film like FIG. 3 is obtained. In FIG. 3, the carbon nanotubes with lighter color than the background are metallic carbon nanotubes, the other carbon nanotubes with deeper color than the background are semiconducting carbon nanotubes.

Figure 4:
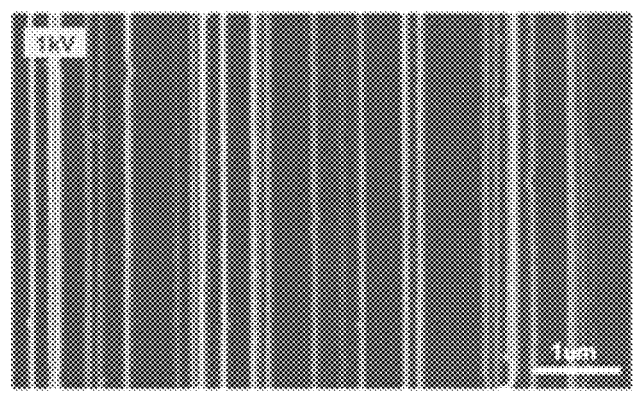
FIG. 4 is a photo of a carbon nanotube film obtained by conventional method of distinguishing carbon nanotubes.

Referring to FIG. 4, in the conventional method of distinguishing carbon nanotubes using a scanning electron microscope, a lower (1 kV or so) accelerating voltage is used in order to obtain a clear and high contrast photograph. In the carbon nanotube photo obtained by the traditional scanning electron microscope characterization method, the electrical conductivity of carbon nanotubes is also related to the color of the carbon nanotubes in the photo. The lighter the color, the better the electrical conductivity. However, the color of all the carbon nanotubes including the metallic carbon nanotubes and the semiconducting carbon nanotubes is lighter than the color of the photo background.

Compared FIG. 4 obtained by the traditional method for characterizing carbon nanotubes by scanning electron microscopy with FIG. 3 obtained by the method for characterizing carbon nanotubes of the present disclosure, the method for distinguishing carbon nanotubes of the present disclosure has the many advantages. The advantages are listed below.

In the carbon nanotube photo obtained by the traditional scanning electron microscope characterizing method, the color of all the carbon nanotubes including metallic carbon nanotubes and semiconducting carbon nanotubes, is lighter than the color of the photo background. When the metallic carbon nanotubes and the semiconducting carbon nanotubes are both present in the photo, it is very hard to distinguish the type of carbon nanotubes having middle color, such as gray carbon nanotubes. However, in carbon nanotube photo obtained by the method for characterizing carbon nanotubes according to present disclosure, the color of metallic carbon nanotubes is lighter than the color of the background, and the color of semiconducting carbon nanotubes is deeper than the color of the background. As such, metallic carbon nanotubes and semiconducting carbon nanotubes can be distinguished quickly and without mistake.

Further, in the carbon nanotube photo obtained by the traditional scanning electron microscope characterization method, the color of both the metallic carbon nanotubes and the semiconducting carbon nanotubes displayed in the photo is lighter than the photo background color, when there is only one type of carbon nanotubes in the photo, it is difficult to judge that the carbon nanotubes in the photo are metallic carbon nanotubes or semiconducting carbon nanotubes. However, in carbon nanotube photo obtained by the method for characterizing carbon nanotubes according to present disclosure, the color of metallic carbon nanotubes is lighter than the color of the background, and the color of semiconducting carbon nanotubes is deeper than the color of the background. As such, even if there is a single type of carbon nanotubes, the type of carbon nanotubes can be distinguished quickly and without mistake.

Further more, compared with FIG. 3, the contract of FIG. 4 is higher, the carbon nanotubes are visually more easily observed, and the photo is more beautiful. However, the photo obtained in the embodiment of the present disclosure is relatively low in contract, and the photo is also relatively not beautiful. As such, in order to get the photo like FIG. 4, lower (1 kV or less than that) accelerating voltage is used in the existing technology to characterize carbon nanotubes. As such, the present disclosure provides a method for distinguishing carbon nanotubes overcoming technical bias and capable of accurately judging the types of carbon nanotubes.

Moreover, compared with FIG. 4, a width of the carbon nanotube in FIG. 3 is relatively small, and therefore, the method for distinguishing carbon nanotube provided by the present disclosure is more suitable for distinguish carbon nanotubes having a higher density.

Step S4 includes sub-steps of:

S41: building a first coordinate system, placing the photo of the carbon nanotube film in the first coordinate system and reading coordinate values of the metallic carbon nanotubes in the first coordinate system;

S42: building a second coordinate system according to the same proportion on the carbon nanotube film as the photo of the carbon nanotube film, and identifying the plurality of metallic carbon nanotubes according to the coordinate values of the plurality of metallic carbon nanotubes in the first coordinate system; and S43: removing the plurality of metallic carbon nanotubes.

In the present embodiment, the semiconducting carbon nanotubes are protected by electron beam exposure, and the metallic carbon nanotubes are exposed, and the metallic carbon nanotubes are removed by plasma etching.

The step of making the semiconducting layer 106 according to the present invention has the following advantages. The carbon nanotubes in the carbon nanotube film can be distinguished by the above-described method, so that the type of the carbon nanotubes can be accurately and quickly judged, and the metallic carbon nanotubes can be removed. The semiconducting layer 106 containing only semiconducting carbon nanotubes is obtained, and therefore, the semiconducting layer 106 has excellent properties.

In step S5, the material of the source electrode 108, the drain electrode 110 has a good conductive property, and can be selected from a group consisting of pure metals, metal alloys, indium tin oxide (ITO), antimony tin oxide (ATO), silver paste, conductive polymer, and metallic carbon nanotubes. A thickness of the source electrode 108 and the drain electrode 110 can be in a range from about 0.5 nanometers to 100 microns. A distance between the source electrode 108 and the drain electrode 110 can be in a range from about 1 to 100 microns.

In one embodiment, when the source electrode 108 and the drain electrode 110 are made of pure metals, metal alloys, indium tin oxide (ITO), or antimony tin oxide (ATO), a conducting layer can be formed by a depositing, sputtering, evaporating method, and etched to form the source electrode 108 and the drain electrode 110. In other embodiments, the source electrode 108 and the drain electrode 110 are made of silver paste or conductive polymer can be formed directly by a print method.

In the present embodiment, the source electrode 108 and the drain electrode 110 are separately formed on two ends of the semiconducting layer 106. The carbon nanotubes in the semiconducting layer 106 aligned along a direction from the source electrode 108 to the drain electrode 110, to form a carrier channel from the source electrode 108 to the drain electrode 110.

In step S5, an protecting layer 112 can be formed on the surface of the semiconducting layer 106. A material of the protecting layer 112 can be a rigid material such as silicon nitride ($Si_3N4$) or silicon dioxide ($SiO_2$), or a flexible material such as PET, benzocyclobutenes (BCB), or acrylic resins. The protecting layer 112 can be depositing, sputtering, evaporating, or printing method according to the material thereof. A thickness of the protecting layer 112 can be in a range from about 0.5 nanometers to about 100 microns.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

Depending on the embodiment, certain of the steps of a method described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A method for making semiconducting layer comprising:
   S1: providing a gate electrode and forming an insulating layer on the gate electrode;
   S2: providing a carbon nanotube film comprising a plurality of metallic carbon nanotubes and a plurality of semiconducting carbon nanotubes;
   S3: laying the carbon nanotube film on a surface of the insulating layer, and placing the carbon nanotube film under a scanning electron microscope to take photo of the carbon nanotube film to distinguish the plurality of metallic carbon nanotubes and the plurality of semiconducting carbon nanotubes;
   S4: removing the metallic carbon nanotubes from the carbon nanotube film to form a semiconducting layer; and
   S5: forming a source electrode and a drain electrode on a surface of the semiconducting layer, wherein the source electrode and the drain electrode are electrically coupled with the semiconducting layer.

2. The method of claim 1, wherein a material of the gate electrode is metal, conductive organic material, or a doped conductive material.

3. The method of claim 1, wherein a material of the gate electrode is doped silicon, and a material of the insulating layer is silicon oxide.

4. The method of claim 1, wherein a material of the insulating layer is oxide or polymer material.

5. The method of claim 4, wherein a thickness of the insulating layer ranges from about 50 nanometers to about 300 nanometers.

6. The method of claim 1, wherein the carbon nanotube film comprises a plurality of carbon nanotubes, and the plurality of carbon nanotubes comprises the plurality of metallic carbon nanotubes and the plurality of semiconducting carbon nanotubes.

7. The method of claim 6, wherein the plurality of carbon nanotubes are parallel with a surface of the insulating layer.

8. The method of claim 1, wherein the accelerating voltage ranges from about 15 KV to about 20 kV.

9. The method of claim 1, wherein the dwelling time ranges from 10 microseconds to 20 microseconds.

10. The method of claim 1, wherein the carbon nanotube film comprise a plurality of metallic carbon nanotubes with a color lighter than a color of the background and a plurality of semiconducting carbon nanotubes with a color deeper than the color of the background.

11. The method of claim 1, wherein step S3 comprises:
    S31: placing the carbon nanotube film with the gate electrode and the insulating layer under the scanning electron microscope, adjusting the scanning electron microscope with an accelerating voltage ranging from about 5 KV to about 20 KV, a dwelling time ranging from about 6 microseconds to about 20 microseconds and a magnification ranging from about 10000 times to about 100000 times, and taking photos of the carbon nanotube film with the scanning electron microscope; and S32: obtaining a photo of the carbon nanotube film, wherein the photo shows the plurality of carbon nanotubes and a background, the plurality of carbon nanotubes includes the plurality of metallic carbon nanotubes with lighter color than a color of the background and the plurality of semiconducting carbon nanotubes with deeper color than the color of the background.

12. The method of claim 1, wherein in step S31, the accelerating voltage ranges from about 15 KV to about 20 kV.

13. The method of claim 1, wherein in step S31, the dwelling time ranges from about 10 microseconds to about 20 microseconds.

14. The method of claim 1, wherein in step S31, the magnification is 20,000 times.

15. The method of claim 1, wherein the step of removing the plurality of metallic carbon nanotubes comprises:

building a first coordinate system, placing the photo of the carbon nanotube film in the first coordinate system and reading coordinate values of the metallic carbon nanotubes in the first coordinate system;

building a second coordinate system according to the same proportion on the carbon nanotube film as the photo of the carbon nanotube film, and identifying the plurality of metallic carbon nanotubes according to the coordinate values of the plurality of metallic carbon nanotubes in the first coordinate system; and removing the plurality of metallic carbon nanotubes.

16. The method of claim 15, wherein the metallic carbon nanotubes are removed by plasma etching.

* * * * *